(12) United States Patent
Eldridge et al.

(10) Patent No.: US 7,884,006 B2
(45) Date of Patent: Feb. 8, 2011

(54) METHOD TO BUILD A WIREBOND PROBE CARD IN A MANY AT A TIME FASHION

(75) Inventors: Benjamin N. Eldridge, Danville, CA (US); Bruce Jeffrey Barbara, Discovery Bay, CA (US)

(73) Assignee: FormFactor, Inc., Livermore, CA (US)

(*) Notice: Subject to any disclaimer, the term of this patent is extended or adjusted under 35 U.S.C. 154(b) by 177 days.

(21) Appl. No.: 12/326,486

(22) Filed: Dec. 2, 2008

(65) Prior Publication Data

US 2009/0142707 A1    Jun. 4, 2009

Related U.S. Application Data

(62) Division of application No. 10/922,486, filed on Aug. 19, 2004, now Pat. No. 7,459,795.

(51) Int. Cl.
*H01L 21/321* (2006.01)
*H01R 13/405* (2006.01)

(52) U.S. Cl. .................. 438/611; 29/827; 29/842; 29/885

(58) Field of Classification Search ........... 438/611; 29/827, 842, 885
See application file for complete search history.

(56) References Cited

U.S. PATENT DOCUMENTS

| | | | |
|---|---|---|---|
| 5,476,211 A | 12/1995 | Khandros | |
| 5,806,181 A | 9/1998 | Khandros et al. | |
| 5,848,685 A | 12/1998 | Smith et al. | |
| 5,852,871 A | 12/1998 | Khandros | |
| 5,944,537 A | 8/1999 | Smith et al. | |
| 5,974,662 A | 11/1999 | Eldridge et al. | |
| 6,023,103 A | 2/2000 | Chang | |
| 6,049,976 A | 4/2000 | Khandros | |
| 6,215,196 B1 | 4/2001 | Eldridge et al. | |
| 6,432,747 B1 | 8/2002 | Everett | |
| 6,482,013 B2* | 11/2002 | Eldridge et al. | ................ 439/66 |
| 6,675,474 B2 | 1/2004 | Mitani et al. | |
| 6,690,185 B1 | 2/2004 | Khandros et al. | |
| 6,747,465 B2* | 6/2004 | Esashi et al. | ................ 324/754 |
| 6,777,319 B2 | 8/2004 | Grube et al. | |

(Continued)

FOREIGN PATENT DOCUMENTS

JP    62-165944    7/1987

(Continued)

*Primary Examiner*—George Fourson
(74) *Attorney, Agent, or Firm*—Kirton & McConkie

(57) ABSTRACT

Resilient spring contacts for use in wafer test probing are provided that can be manufactured with a very fine pitch spacing and precisely located on a support substrate. The resilient contact structures are adapted for wire bonding to an electrical circuit on a space transformer substrate. The support substrates with attached spring contacts can be manufactured together in large numbers and diced up and tested before attachment to a space transformer substrate to improve yield. The resilient spring contacts are manufactured using photolithographic techniques to form the contacts on a release layer, before the spring contacts are epoxied to the support substrate and the release layer removed. The support substrate can be transparent to allow alignment of the contacts and testing of optical components beneath. The support substrate can include a ground plane provided beneath the spring contacts for improved impedance matching.

4 Claims, 8 Drawing Sheets

U.S. PATENT DOCUMENTS

| | | |
|---|---|---|
| 6,818,840 B2 | 11/2004 | Khandros |
| 6,838,893 B2 | 1/2005 | Khandros et al. |
| 6,939,474 B2 * | 9/2005 | Eldridge et al. ............... 216/11 |
| 7,047,638 B2 | 5/2006 | Eldridge et al. |
| 7,061,257 B2 | 6/2006 | Khandros et al. |
| 7,064,566 B2 | 6/2006 | Khandros et al. |
| 7,215,131 B1 | 5/2007 | Eslamy et al. |
| 7,459,795 B2 | 12/2008 | Eldridge et al. |
| 2001/0021483 A1 * | 9/2001 | Mathieu et al. ............ 430/311 |
| 2001/0054905 A1 | 12/2001 | Khandros et al. |
| 2002/0019152 A1 * | 2/2002 | Eldridge et al. ............... 439/66 |
| 2003/0099097 A1 | 5/2003 | Mok et al. |
| 2004/0018752 A1 * | 1/2004 | Lee ............................. 439/43 |
| 2006/0191136 A1 | 8/2006 | Eldridge et al. |
| 2006/0279300 A1 | 12/2006 | Khandros et al. |
| 2008/0074131 A1 | 3/2008 | Kim |

FOREIGN PATENT DOCUMENTS

JP        2003035723 A  *  2/2003

* cited by examiner

METHOD TO BUILD A WIREBOND PROBE CARD IN A MANY AT A TIME FASHION

BACKGROUND

1. Technical Field

The present invention relates to a resilient electrical contact element, or spring contact for making pressure contacts between electrical components, and more particularly to spring contacts and a structure for attachment of the spring contacts to a substrate to form a probe card for use in probing to test integrated circuits (ICs) on a wafer.

2. Related Art

Resilient contact elements, or spring contacts are manufactured in a variety of forms. One type of spring contacts used for probing ICs on a wafer is described in U.S. Pat. No. 5,476,211 entitled "Method of Manufacturing Electrical Contacts, Using a Sacrificial Member" and its counterpart divisional patents, U.S. Pat. Nos. 5,852,871, and 6,049,976, all by Khandros. These patents disclose methods for making resilient interconnection elements by mounting a flexible elongate core element (e.g., wire "stem" or "skeleton") to a terminal on an electronic component and coating the flexible core element with a "shell" of one or more materials to ensure the resilient nature of resulting spring contacts. Exemplary materials for the core element include gold. Exemplary materials for the resilient coating include nickel and its alloys. The resulting spring contact element is used to make pressure connections between two or more electronic components including between a probe card and integrated circuits on a wafer.

Connection of the spring contacts to a substrate to form a probe card, or other structure with spring contacts is described in U.S. Pat. No. 5,974,662, entitled "method of Planarizing Tips of Probe Elements of a Probe Card Assembly" by Eldridge, Grube, Khandros and Mathieu. This patent describes a probe card assembly, including a substrate with elongate resilient spring contact elements mounted to form a "space transformer." A space transformer is a multilayer interconnection substrate having terminals disposed at a first pitch, or spacing between terminals, on a one surface and having corresponding terminals disposed at a second pitch on an opposite surface. Space transformation is provided by routing lines in the layers of the substrate used to effect "pitch-spreading" from the first pitch to the second pitch. In use, the free ends (tips) of the elongate spring contact elements make pressure connections with corresponding terminals on an electronic component being probed or tested.

Another type of spring contact elements is described in U.S. Pat. No. 6,482,013, entitled "Microelectronic Spring Contact Element and Electronic Component Having A Plurality Of Spring Contact Elements" by Eldridge, Grube, Khandros and Mathieu, incorporated herein by reference. This patent describes photo lithographic rather than mechanical techniques to fabricate resilient contact elements. As with the mechanically formed contact elements, the resilient contact elements formed using lithographic techniques include a resilient material, such as nickel and its alloys. To manufacture a probe card, or other substrate with resilient contacts using photolithographic techniques, the spring contacts are formed on metal interconnect pads on the surface of the substrate by a series of steps including plating or deposition of material, applying photoresist, masking using photolithographic techniques, and etching. For a space transformer, the interconnect pads on which the resilient contacts are formed connect the resilient contacts to routing lines within the space transformer substrate. Using photographic techniques, close tolerances can be realized to assure alignment of the spring contacts formed thereon with corresponding contact pads on an integrated circuit being tested.

SUMMARY

In accordance with the present invention, resilient contact structures are described that can be manufactured with a very fine pitch and precisely located on a support substrate. The resilient contact structures are adapted for wire bonding on one end to make electrical contact with a circuit, while providing a spring contact on another end. Support substrates with these spring contacts can be made in a many at a time fashion, reducing manufacturing costs, and providing redundancy to increase manufacturing yield.

The resilient contact structure in accordance with the present invention is made using photolithographic techniques. The resilient contact structure is formed on a release layer of a sacrificial substrate, and then affixed by an adhesive material to the support substrate before the sacrificial substrate is removed. The support substrate now supporting the resilient contact structures is then attached to a base substrate that includes transmission lines. The base substrate can be directly attached using an adhesive. As an alternative, the base substrate is attached by resilient springs so that the support substrate provides a compliant platform.

Transmission lines of the base substrate in one embodiment are attached by wire bonding to the resilient contacts. In another embodiment when springs are used to create the compliant platform, flexible conductive leads are used to connect the resilient contacts to the base substrate. With the transmission lines of the base substrate routing signals from the resilient contacts on one surface to a finer pitch set of contacts, it can form a "space transformer" substrate typically used in wafer probing. For convenience, the base substrate is subsequently referred to as a space transformer substrate.

In one embodiment, the support substrate has a metal coating forming a ground plane provided beneath the attached resilient contact structures. The adhesive attaching the resilient contact structures to the support substrate is then a non-conductive material, such as epoxy, to electrically isolate the contact structures from the ground plane. The ground plane then provides for better impedance matching through the resilient contact structure and wire bonds that connect to lines of the space transformer substrate.

In a further embodiment, the support substrate is made of a transparent dielectric material, such as glass. By being transparent, alignment for attachment of the support substrate to the space transformer substrate can be easily performed to assure the resilient spring contacts will align with contacts on another device, such as a wafer to be tested. Further with a transparent substrate, a light source can be provided through the substrate to test light sensitive components.

In a further embodiment, conductive vias are provided through the support substrate. The vias in one embodiment include solder bumps on one side for attaching to traces on the space transformer substrate. Other connection mechanisms than solder bumps, such as conductive epoxy, or otherwise, can be used to attach the vias to traces on the space transformer substrate. The resilient contact elements are wire bonded on traces connecting to the vias, or directly on the vias on the opposing side of the support substrate. With a ground plane used on the support substrate, isolation is provided between the signal line vias and the ground plane region on the support substrate. The ground plane can further be connected by a via to a ground line of the space transformer substrate.

In an additional embodiment, the resilient contact elements are formed in groups on a single support substrate, and after manufacture the support substrate is diced up into individual tiles for bonding to one or more of the space transformer substrate. The tiles can include spring contacts arranged for testing ICs on a single device under test (DUT), or multiple DUTs. After attaching the tiles to the space transformer substrate, wire bonding or another scheme to attach wires is performed to electrically connect the resilient contact elements to transmission lines on the space transformer substrate. Dicing of the support substrate enables tiles with defective contacts to be discarded, while non-defective tiles are used, increasing manufacturing yield.

BRIEF DESCRIPTION OF THE DRAWINGS

Further details of the present invention are explained with the help of the attached drawings in which:

FIG. 9 shows a resilient contact with wire bonding to a bond pad, similar to FIG. 8, but with a traces wire bonded in-between;

DETAILED DESCRIPTION

Figure 1A:
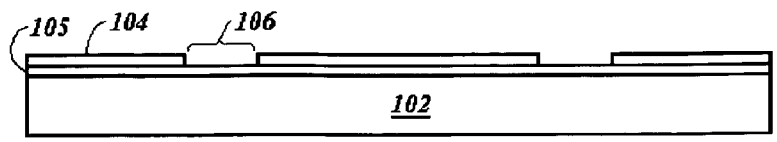
FIGS. 1A-1P are cross sectional views showing manufacturing steps for resilient contact elements provided on a support substrate in accordance with the present invention.
Figure 1B:
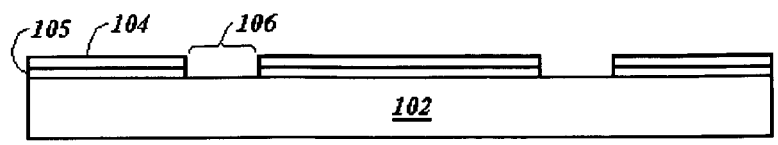
Figure 1C:
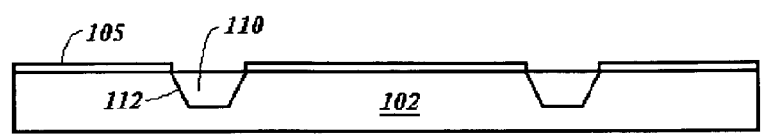
Figure 1D:
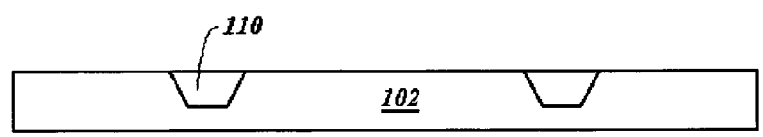
Figures 1, 1D:
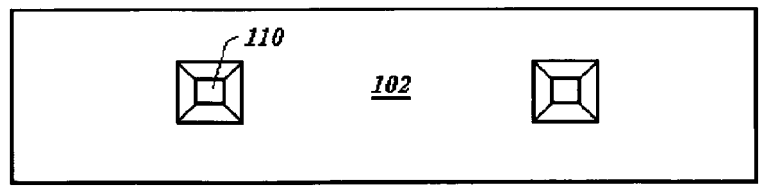
Figure 1E:
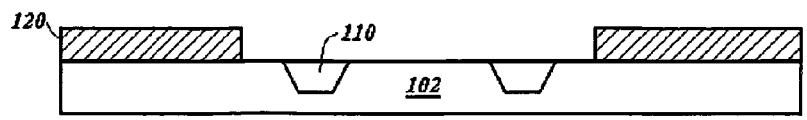
Figure 1F:
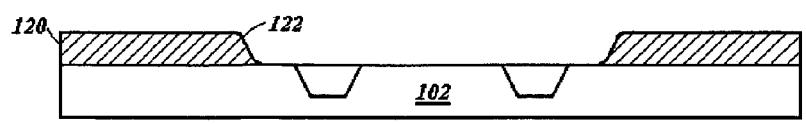
Figure 1G:
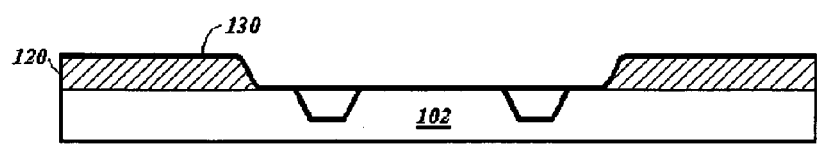
Figure 1H:
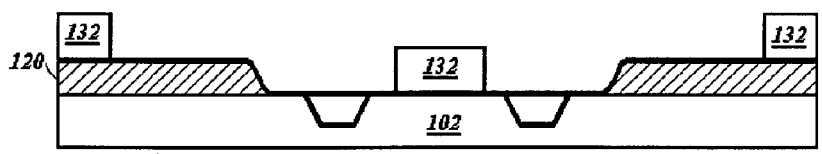
Figure 1I:
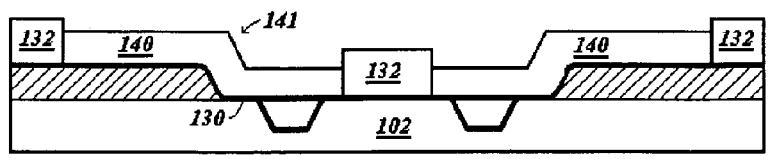
Figure 1J:
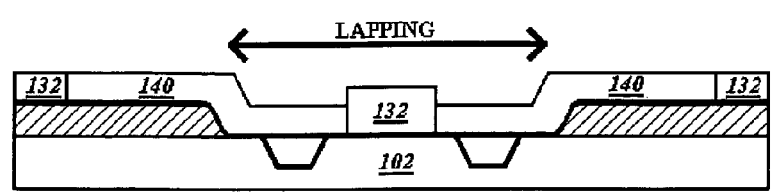
Figure 1K:
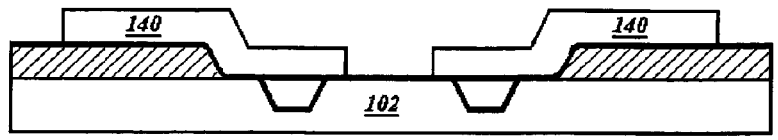
Figure 1L:
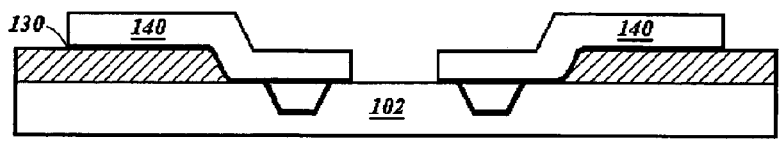
Figure 1M:
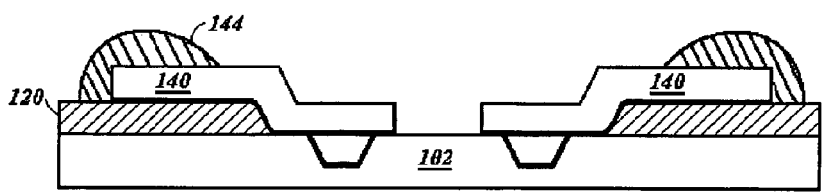
Figure 1N:
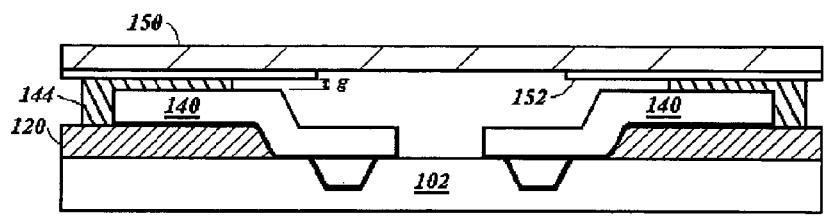
Figure 1O:
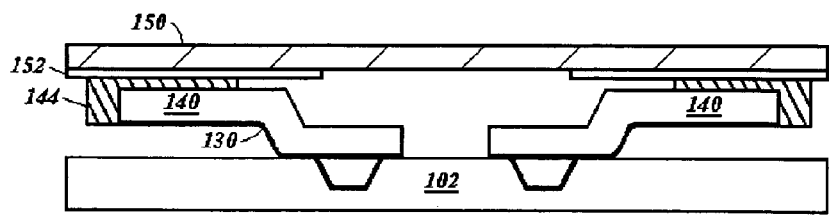
Figure 1P:
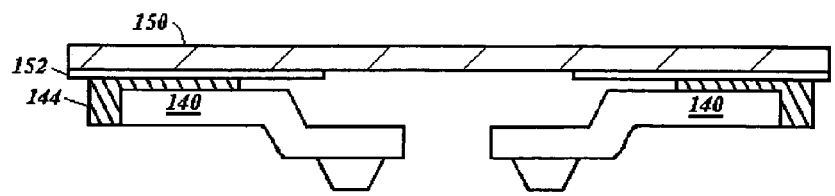

FIGS. 1A-1P illustrate showing manufacturing steps for resilient contact elements provided on a tile substrate in accordance with the present invention. The present invention is not limited to the manufacturing steps shown.

As illustrated in FIG. 1A, the process commences with a suitable sacrificial substrate 102, such as a silicon wafer. The sacrificial substrate 102 can further be composed of a material, such as aluminum, copper, ceramic, titanium-tungsten, and the like. On the sacrificial substrate, a blanket layer 105 of etch stop material, such as silicon nitride or silicon dioxide, is applied. A layer of masking material 104, such as photoresist, is then applied over the etch stop material 105. The masking material 104 is then imaged and developed using photolithographic techniques to expose areas 106 of the etch stop material 105 over the sacrificial substrate 102. Alternatively selected portions of the photoresist 104 can be removed employing other techniques, such as known techniques involving lasers, and the resulting exposed portions of the masking layer 104 can be removed using chemical etching processes, the result of which is that openings 106 in the photoresist 104 to the surface of the etch stop material 105 are created.

In a subsequent step, illustrated in FIG. 1B, the exposed etch stop material 105 is etched with an etchant, such as hydrofluoric acid (HF) to expose the substrate 102 in openings 106. The remaining photoresist material 104 is then removed leaving etch stop material 105 over areas of the substrate 102 other than the openings 106.

In a subsequent step, illustrated in FIG. 1C, the sacrificial substrate 102 is etched in the openings 106, using known chemistry for selectively etching the substrate. For example, a silicon substrate can selectively be etched using potassium hydroxide (KOH). This will create a small geometric intrusion (depression or trench) 110 in the substrate 102, the depth of which is controlled by etch timing to correspond to a desired depth for the intrusion. Also, in the case of employing a silicon wafer as the sacrificial substrate 102, the sidewall 112 of the intrusion 110 will be an angle other than vertical. As will be evident in the description to follow, the intrusion or trench 110 will define a topological feature present on the tip of a resilient contact structure (pyramid, truncated pyramid, etc.) In addition to being formed by etching using potassium hydroxide, the intrusion can also be formed by dimpling a metal substrate, dry etching as by reactive ion etching, or other procedures known in the art.

After creating the intrusions 110, the etch stop material 105 is preferably removed, as illustrated in cross section in FIG. 1D. FIG. 1D-1 shows a top view of the sacrificial substrate 102, shown in cross section in FIG. 1D, with intrusions 110.

In a next step illustrated in FIG. 1E, an additional layer of photoresist 120 is applied and patterned using photolithographic techniques, leaving photoresist areas adjacent intrusions 110 exposed. The photoresist 120 may further optionally be slumped or shaped as shown in FIG. 1F, in area 122. The slumping 122 is performed by heating of the photoresist. Shaping may be done by angular exposure of the photoresist material 120 in the area 122, and then subsequent etching. The slumped area forms a mold for a bend in a resilient contact structure. Slumping or shaping makes it easier to metalize the surface of the photoresist by sputtering. Alternatively, the cross section of FIG. 1F may be made by applying an etch stop material, such as silicon dioxide or silicon nitride, and then etching as described in U.S. Pat. No. 6,482,013 referenced previously.

In a next step illustrated in FIG. 1G, one or more metallic layers 130 are blanket deposited, such as by sputtering, onto the substrate 102. In one embodiment, the metallic layer is composed of two materials, the first material, such as aluminum, being selected as a release layer, and a second layer serving as a "seed" layer for deposition of subsequent layers. As an example, the metallic layer 130 may be composed of a release layer of aluminum followed by a seed layer of copper. The release material permits the sacrificial substrate to be removed after the spring contact elements fabricated thereon (as described herein) are mounted to a support substrate. The release material may be removed from the final spring contact after acting as a protective "capping" layer during the release process.

Next, as illustrated in FIG. 1H, an additional masking layer 132, such as photoresist, is applied to the substrate 102. The photoresist 132 is patterned to define openings effectively forming a mold defining lengths and widths desired for a resulting spring contact elements.

The resilient contact structures 140 are then formed by applying a layer of metal between the photoresist regions 132, as illustrated in FIG. 1I to form resilient contacts. The relatively thick "structural" metallic layer deposited between photoresist regions 132, is applied using a suitable process such as electroplating of a resilient material, such as nickel, as set forth previously, atop the release layer 130. As an alternative to electroplating, techniques such as chemical vapor deposition (CVD), physical vapor deposition (PVD), or other techniques available in the art could be used to apply the metal forming the resilient contact structures 140.

The metal layer described as forming the resilient contact structures 140 is intended to control or dominate the mechanical characteristics of the resulting spring contact element. It is within the scope of this invention that additional layers may be included in the build-up of the resilient contact structure. For example, prior to depositing the resilient material such as nickel, a layer of a material selected for its superior electrical characteristics of electrical conductivity, low contact resistance, solderability, and resistance to corrosion may be deposited. For example, gold or rhodium, (both of which are good contact materials), nickel-cobalt (a good material for brazing). In one embodiment, prior to depositing the resilient material, a material is applied which is suitable for wire bonding, such as gold, aluminum, palladium cobalt, etc.

Once formed, the contact structures 140 and photoresist material 132 can optionally be lapped flat, as illustrated in FIG. 1J. With spring behavior being a function of thickness of the spring contact, lapping allows for a more precise control of the spring constant. The contact structures 140 can be flattened by grinding, chemical or mechanical polishing (CMP), milling, or other suitable processes used for planarization. The elongate resilient contact structure 140 shown includes a single bend region, although multiple bends may be included, as described in U.S. Pat. No. 6,482,013, referenced previously.

In a subsequent step shown in FIG. 1K, the photoresist material 132 is stripped away, exposing ends of the spring contacts 140. The exposed blanket sputtered metal 130 is further removed as shown in FIG. 1L leaving only the sputtered metal 130 beneath resilient contacts 140.

In a subsequent step illustrated in FIG. 1M, an adhesive material 144, such as epoxy, is applied over an end of the resilient contacts 140 and a portion of the photoresist 120. The adhesive may be filled with particles for added strength as is known in the art. In a further step shown in FIG. 1N, a support substrate 150 is applied over the epoxy, and the epoxy cured. The cured epoxy bonds the support substrate 150 to the resilient contacts 140, as shown in FIG. 1O. In one embodiment, the support substrate 150 is a transparent material, such as glass, allowing for visual alignment of the resilient contacts 140 by looking through the transparent substrate when placing it on a space transformer substrate. The support substrate 150 can likewise be another dielectric material, such as a polymer or a ceramic, or a conductive material such as metal.

In one embodiment, a conductive metal material 152 can be applied in one or more regions of the support substrate 150 to form a ground plane underlying the resilient contacts 140, as illustrated in FIG. 1N. The ground plane 152 serves to provide a capacitive layer beneath the resilient contacts 140, providing for better impedance matching. Sizing of one or more ground plane regions 152 underlying the contact elements 140, as well as sizing of the gap width "g" in FIG. 1N can be adjusted for impedance matching. In one embodiment, the entire support substrate 150 can be formed from a conductive metal material with the adhesive material 144 forming a non-conductive dielectric electrically isolating the support substrate (or ground plane) from the resilient contacts 140. The ground plane can also be formed on the opposite side of support substrate 150.

With the resilient contacts 140 now affixed to the support substrate 150 by adhesive 144, in subsequent steps the photoresist material 120 is stripped away, as illustrated in FIG. 1O, and the remaining blanket sputter metal 130 separating the sacrificial substrate 102 is etched away along with the sacrificial substrate 102, as illustrated in FIG. 1P.

FIGS. 1A-1P describe an exemplary process for fabricating elongated resilient (spring) interconnection (contact) elements on a support substrate. This can be considered to be an "interim" product, available for further use as described to follow.

Figure 2:
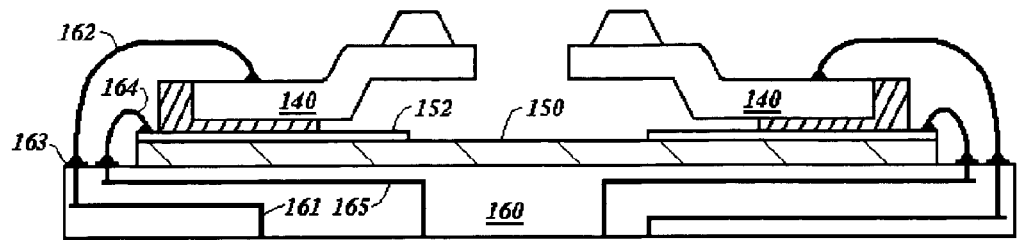
FIG. 2 is a cross sectional view of resilient contact structures on a support structure, with the support structure attached to a space transformer substrate and wire bonds provided from both contact elements and a ground plane to contacts on the space transformer substrate.

The support substrate 150 with contact structures 140, as formed in FIGS. 1A-1P, in one embodiment is glued or bonded to a further substrate 160 containing electrical routing lines 161, as shown in FIG. 2. The contact structures 140 are then connected by wire bonds 162 to contact to bond pads 163 connecting to routing lines 161 in the substrate 160. In one embodiment, the ground plane regions 152 are further connected by one or more wire bonds 164 to a ground connection line 165 provided through the substrate 160. With the substrate 160 providing electrical routing from wire bond pads 163 through routing lines 161 to contacts at another pitch on an opposing surface of substrate 160, the substrate 160 effectively forms a "space transformer" substrate. Although shown mounted on a space transformer substrate 160, the substrate 160 can take other forms, such as a substrate with routing lines only on its surface, or a substrate with through line vias not providing any "space transformation." The substrate 160 can be formed from a multilayer ceramic material, a polymer material effectively forming a PCB, or other material as would be deemed suitable to a person of ordinary skill. For convenience, further reference to a substrate, such as substrate 160, attaching to a resilient contact support substrate, such as support substrate 150, will be referred to as a "space transformer substrate."

Figure 3:
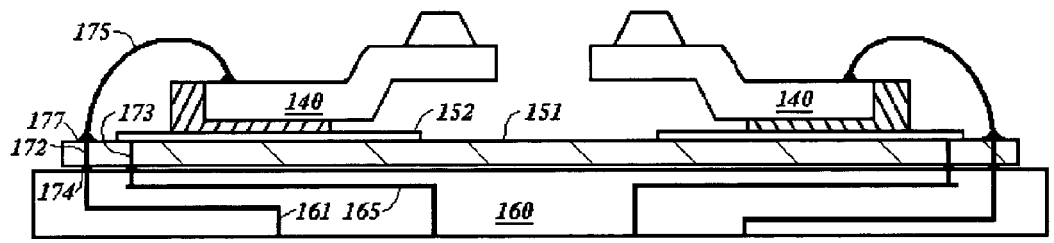
FIG. 3 is a cross sectional view of resilient contact structures on a support structure, with the support substrate including vias attached by solder bumps to routing lines in a space transformer substrate, and wire bonds provided from the resilient contact structures to the vias.

FIG. 3 shows another configuration for mounting to a space transformer substrate 160, where the support substrate 151 is modified to contains vias 172. The vias 172 provide conductive lines from bond pads 177 on the surface of the support substrate 151 to solder bumps 174 provided on an opposing side of the support substrate 151. The solder bumps 174 can serve to connect the support substrate 151 to the space transformer substrate 160. Alternatively, in addition to the solder bumps 174, an adhesive fill material such as epoxy or underfill as known in the art (not shown) is further provided between the support substrate 151 and space transformer substrate 160 to connect the substrates. The solder bumps 174 connect the vias 172 to electrical routing lines 161 within the space transformer substrate 160. Opposing ends of the vias 172 include bumps or bond pads 177 that are then connected by wire bonds 175 to the contact structures 140. One or more additional vias 173 can be provided to connect the ground planes regions 152 to ground lines 161 within the space transformer substrate 160.

Figure 4:
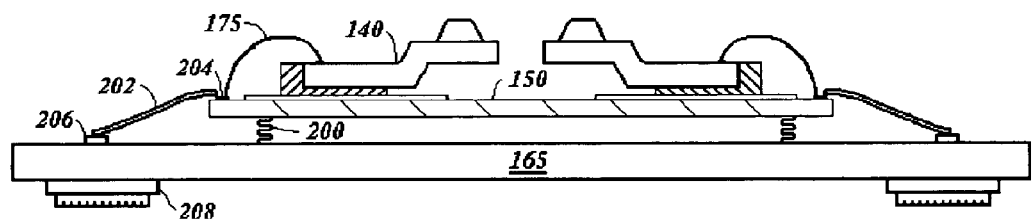
FIG. 4 is a cross sectional view, with the support substrate attached to the PCB by resilient springs forming a compliant platform for probing a wafer.

FIG. 4 shows another configuration for mounting where resilient springs 200 are provided between the support substrate 150 and a printed circuit board (PCB) 165. By being mounted on resilient springs 200, the support structure 150 forms a compliant platform for testing components on a wafer, the compliant nature limiting the possibility of damaging the wafer or the components formed thereon during test probing. The resilient springs 200 can be a metal coil spring as shown, an elongated spring similar to the resilient contacts 140, a spring structure made from a resilient elastomer or flexible material such as rubber, or other resilient material as known in the art. Flexible conductive connections 202 connect the PCB 165 to the resilient contacts 140. The flexible connections 202 are shown in FIG. 4 to be bonded to pads 204 on the support structure 150, and to a socket 206 or other flex connection on the PCB substrate 165. The flexible connections 202 are connected to the bond pad 204 and socket 206 using thermosonic compression, or other bonding procedures known in the art. Wire bonds 175 connect the resilient contacts 140 to the bond pad 204. Routing lines within the space transformer PCB 165 (not shown) connect the flex connection 202 to connectors 208 on the opposing side of the PCB 165 for connecting to a wafer tester.

Figure 5:
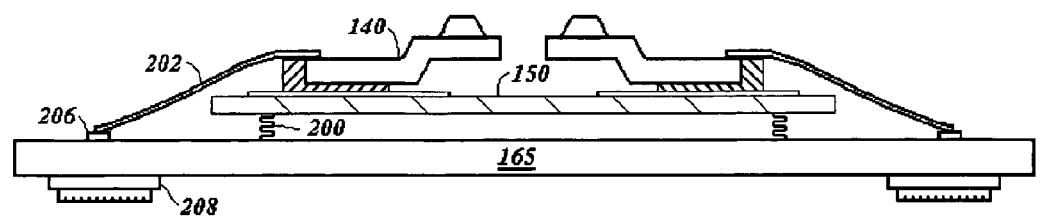
FIG. 5 shows modification to the compliant platform configuration of FIG. 4 so that the resilient contact structures are connected by flexible leads directly to the PCB without the need of separate wire bonding.

FIG. 5 shows modification to the compliant platform configuration of FIG. 4 so that the resilient contacts 140 are connected by the flexible connections 202 directly to the pad 206 on the PCB substrate 165 without using a separate wire bond 175. The structure of FIG. 5 may be useful to simplify manufacturing if the flexible connections do not place a significant amount of force on the resilient contacts 140, or if better electrical properties are obtained by having a shorter electrical path from the resilient contacts 140 to the PCB substrate 165.

Figure 6:
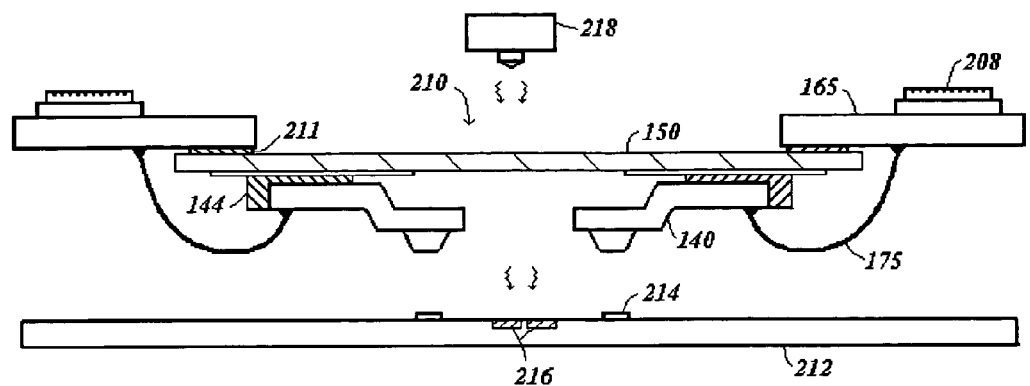
FIG. 6 is a cross sectional view showing resilient contact structures on a transparent support structure attached to a PCB to enable wafer probing, the PCB having openings allowing light to pass through the transparent support to enable testing of light sensitive devices.

FIG. 6 shows another configuration where resilient contacts 140 are provided on a transparent support substrate 150 and mounted on a PCB 165, the PCB 165 having one or more openings 210 allowing light to pass through the transparent support substrate 150 to enable testing of light sensitive devices. The substrate 150 can be attached to the PCB 165 using an adhesive, such as epoxy similar to adhesive material 144, or using resilient springs to form a compliant platform as in FIGS. 4-5. The configuration of FIG. 6 is shown provided over a wafer 212, with the resilient contacts 140 aligned for probing pads 214 on the wafer 212 to test ICs on the wafer. Signals to and from the resilient contacts 140 are provided through connectors 208 to a tester as shown in FIGS. 4-5. The wafer 212 is further shown with light sensitive devices 216, such as charge coupled devices (CCDs), image sensors for cell phones with cameras, or similar optical components that are light sensitive. A light source 218, such as a laser or light emitting diode, is shown provided over the test structure. Light emitted from source 218 is provided through an opening 210 in the PCB 165, and through the transparent support substrate 150 to provide signals to the light sensitive components 216 on the wafer 212 for testing. Testing of optical and electrical components on the wafer 212 can, thus, be done concurrently.

Figure 7:
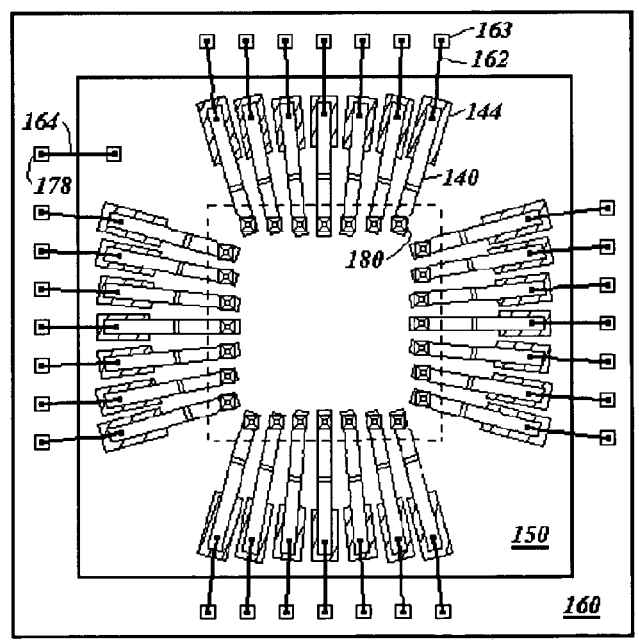
FIG. 7 shows a top view of resilient contact structures on the support substrate, as configured to contact one configuration of pads on a DUT, with wire bonding of resilient contact structures as illustrated in FIG. 2.

FIG. 7 shows a top view of resilient contact structures 140 on the support substrate 150, as set to contact one configuration of pads on a single DUT. In FIG. 7, wire bonding is provided from the resilient contact structures 140 to bond pads 163 on a space transformer substrate 160, similar to the configuration shown in cross-section in FIG. 2. The resilient contact structures 140 are arranged on the support substrate 150 so that tips 180 (formed in intrusions 110 shown in FIG. 1D-1) are provided over the DUT contacts pads (not shown). Dashed lines illustrate the peripheral area of a DUT, with one configuration of pads arranged around the periphery of the DUT. Wire bonds 162 connect the contact structures 140 to contact pads 163 on the space transformer substrate 160. A further wire bond 164 connects a ground plane on the surface of support substrate 150 to a ground line contact pad 178 on the space transformer substrate 160. The wire bond 164 leading to ground is placed in close proximity to signal lines for good signal fidelity. Although only a single ground line 164 is shown, additional lines can be provided to improve signal fidelity. In FIG. 7, it is assumed that a ground plane is provided over the entire surface of the support substrate 150, however, individual ground plane regions underlying one or more of the contact structures 140 might alternatively be used. The non-conductive adhesive material 144 separates the ground plane region from the contact structures 140. The contact pads 163 and 178, in one embodiment, are assumed connected to internal lines in the space transformer 160, similar to the arrangement of lines illustrated in FIG. 2.

Figure 8:
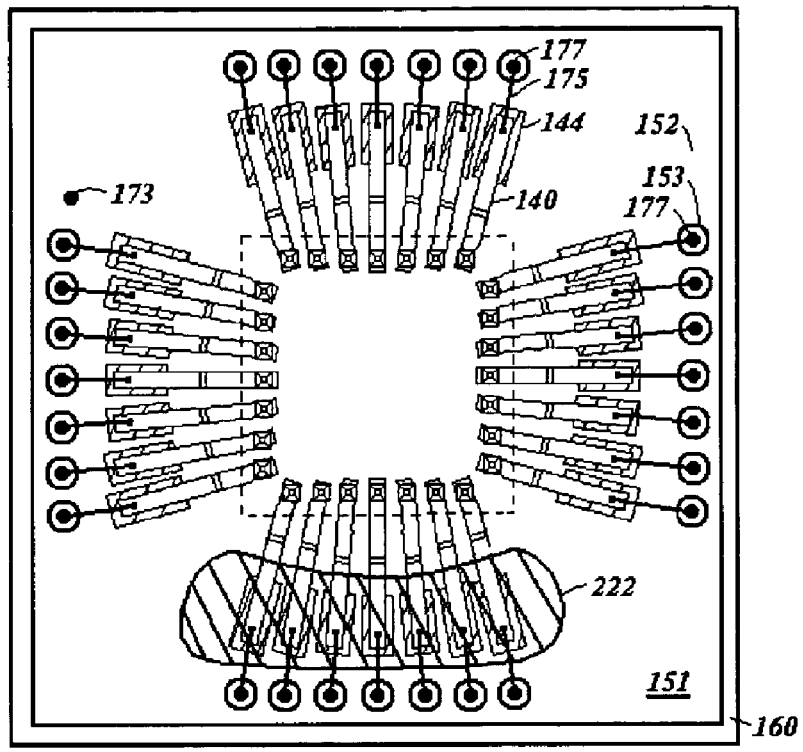
FIG. 8 shows a top view of resilient contact structures on the support substrate alternatively having vias for connecting to the space transformer substrate, with wire bonding of resilient contact structures to the vias as illustrated in FIG. 3.

FIG. 8 shows a top view of resilient contact structures 140 on a support substrate 151 alternatively having pads and vias for connecting to a space transformer substrate 166, similar to the arrangement of FIG. 3. The signal vias are terminated into pads 177 on the substrate 151. The ground plane region 152 on the support substrate 151 then has openings 153 to electrically isolate the signal pads 177 connecting to vias. Although the ground plane region 152 is shown surrounding the signal pads 177, as an alternative, the signal pads 177 could be provided outside a ground plane region on the support substrate 151. The ground plane regions 152 are then directly connected by a via 173 to a ground line in the space transformer substrate 160. The contact structures 140 are electrically isolated from the ground planes 152 by non-conductive adhesive material 144. The resilient contact structures 140 are connected by wire bonds 175 to the bond pads 177. As discussed previously, the size of the ground plane region 152 (or regions if separate ground planes underlie each contact) can be adjusted to control the resulting impedance through the wire bond 175 and contact structure 140. In one embodiment, an adhesive material 222 can be dispensed in continuous beads over a number of probes. As noted previously, the adhesive material 222 is provided to improve the flexural strength, or prevent pealing of the probes 140 from the support substrate 151. Examples of the adhesive material 222 include an epoxy resin, filled epoxy, cyanate ester, BCB or other materials with adhesive properties recognized in the art.

Figure 9:
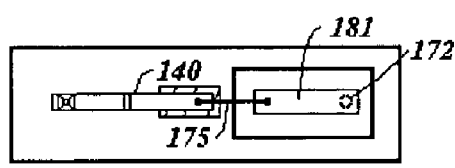
Figure 10:
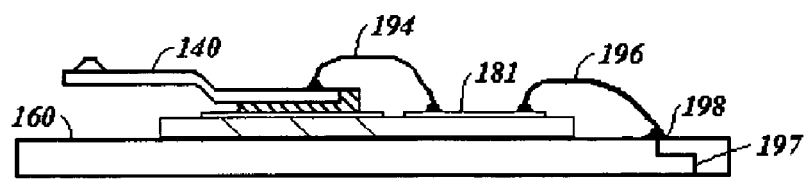
FIG. 10 shows a resilient contact with wire bonding through a trace to a bond pad, similar to FIG. 9, but with the bond pad connected by a trace to a via.

As an alternative to directly wire bonding a resilient contact 140 to a pad 177 over a via as shown in FIG. 8, a length of trace 181 can added as illustrated in FIG. 9. The length of trace 181 connects the bond wire 175 to the via 172. The length and size of trace 181 can be adjusted for improved impedance matching. The trace 181 further can include a thin film resistor sized to provide for impedance matching. A higher impedance can be achieved with the thin film resistor provided in trace 181, as opposed to simply adjusting the size of a conductive line making up trace 181. The thin film resistor could serve as a series element in a conductive line, or as a termination. The trace 181 can also include a high frequency capacitor. The capacitor could serve as a descrete series element, or could provide a bypass to ground. An alternative to FIG. 9 is shown in FIG. 10 with the trace 181 providing a bond pad connection, rather than using a via. As shown in FIG. 10, a first bond wire 194 connects the resilient contact 140 to a first end of trace 181, while another bond wire 196 connects a second end of the trace 181 to a bond pad 198 on space transformer substrate 160. An internal routing line 197 in space transformer substrate 160 connects the bond pad 198 to an opposing side of the substrate 160.

Figure 11:
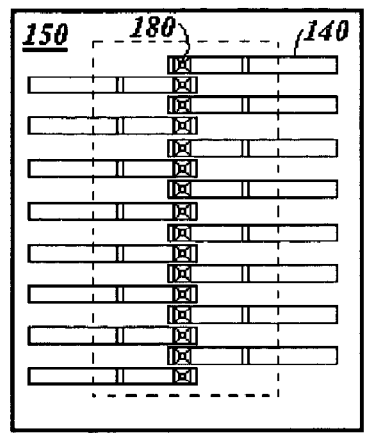
FIG. 11 shows a top view of an alternative configuration of resilient contact structures, as set to contact a different configuration of DUT pads than the configuration shown in FIGS. 7 and 8.

FIG. 11 shows a top view of an alternative configuration to that shown in FIGS. 7 and 8 for the arrangement of resilient contact structures 140 on a support substrate 150. As shown, the resilient contact structures 140 are rearranged so that tips 180 are aligned over pads arranged along a centerline of a DUT. The DUT perimeter is illustrated by dashed lines. Although not shown in FIG. 7, wire bonding and ground planes can be provided as described previously.

Figure 12:
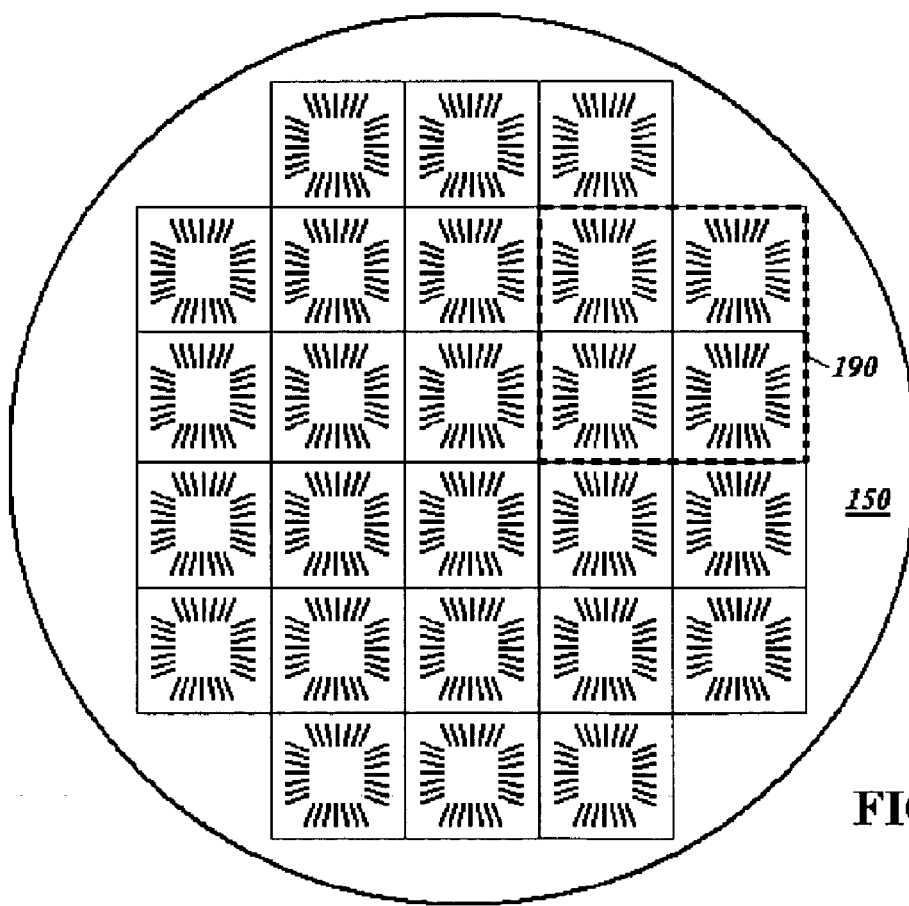
FIG. 12 shows a top view of a substrate on which resilient contact structures are formed, illustrating how the substrate can be diced up to improve manufacturing yield.

FIG. 12 shows a top view of a substrate 150 on which resilient contact structures are formed illustrating how the substrate 150 can be manufactured and then diced up to improve manufacturing yield. The configuration shown includes groups of resilient spring contacts configured to contact with pads on a DUT having contacts around its periphery as illustrated in FIGS. 7 and 8. Twenty-six groups of spring contacts are illustrated as formed on a support substrate 150 having the shape of a wafer. Lines illustrate boundaries of individual ones of the groups of spring contacts. Cuts can be made along the lines to dice up the support substrate 150 into twenty-six individual DUT test structures. The individual support substrate tiles can be tested, either before or after dicing, and if testing proves a tile is functional, the tile can be attached to a space transformer substrate, as discussed previously. By dicing up the support substrate 150 to form individual tiles, and discarding non-functional tiles, manufacturing yield can be improved.

As an alternative to dicing along the lines shown in FIG. 12, dicing can be performed to keep two or more of the groups of resilient contacts together, as illustrated by the larger dashed lines 190. Precision alignment of the groups of contacts relative to each other can, thus, be maintained while increased manufacturing yield is still provided with some groups of four being discarded if they are non-functional.

Figure 13:
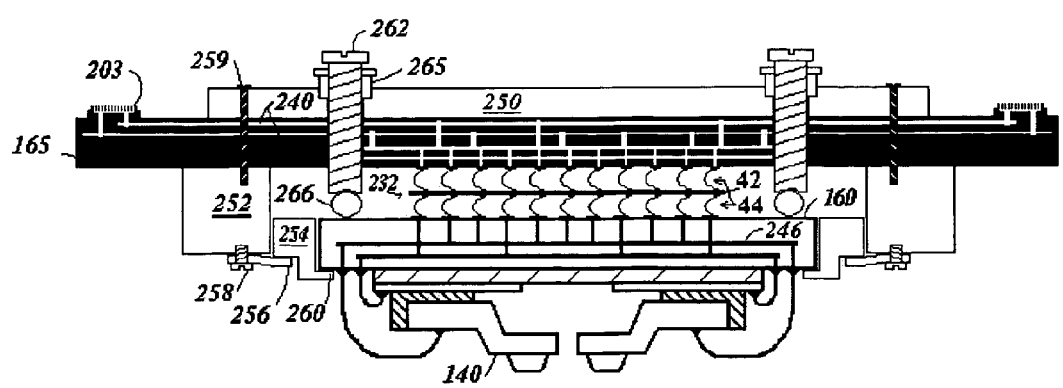
FIG. 13 shows a cross sectional view of components of a probe card illustrating flexible mounting of a space transformer substrate, as an alternative to FIGS. 4-5.

FIG. 13 shows a cross sectional view of components of a probe card illustrating flexible mounting of a space transformer substrate 160, as an alternative to the resilient springs 200 used in FIGS. 4-5, to connect to a PCB 165 containing connectors 203 for connecting to a test system controller. The space transformer substrate 160 can be configured as shown in FIGS. 2-3, or as a system with openings allowing optical connections similar to FIG. 6 to be flexibly mounted using the system shown in FIG. 13. Other configurations, as illustrated in FIGS. 7-11 can likewise be flexibly mounted as illustrated in FIG. 13.

The probe card of FIG. 13 is shown configured to provide both electrical pathways and mechanical support for the probes 140 that will directly contact a wafer. FIG. 13 includes a space transformer 160 configured as shown in FIG. 2. The probe card electrical pathways are provided through the space transformer 160 as well as a printed circuit board (PCB) 165, and an interposer 232. Test data for a test system controller is provided through pogo pins or zero insertion force (ZIF) connectors 203 connected around the periphery of the PCB 165. Channel transmission lines 240 distribute signals from the tester interface connectors (pogo or ZIF) 203 horizontally in the PCB 165 to contact pads on the PCB 165 to match the routing pitch of pads on the space transformer 160. The interposer 232 includes a substrate 42 with spring probe electrical contacts 44 disposed on both sides. The interposer 232 electrically connects individual pads on the PCB 165 to pads forming a land grid array (LGA) on the space transformer 160. The LGA pad connections are typically arranged in a regular multi-row pattern. Transmission lines 246 in a substrate 45 of the space transformer 160 distribute or "space transform" signal lines from the LGA to spring probes 140 configured in an array. The space transformer 160 with embedded circuitry, probes and LGA is referred to as a probe head.

Mechanical support for the electrical components is provided by a back plate 250, bracket 252, frame 254, leaf springs 256, and leveling pins 262. The back plate 250 is provided on one side of the PCB 165, while the bracket 252 is provided on the other side and attached by screws 259. The leaf springs 256 are attached by screws 258 to the bracket 252. The leaf springs 256 extend to movably hold the frame 254 within the interior walls of the bracket 252. The frame 254 then includes horizontal extensions 260 for supporting the space transformer 160 within its interior walls. The frame 254 surrounds the probe head and maintains a close tolerance to the bracket 252 such that lateral motion is limited.

Leveling pins 262 complete the mechanical support for the electrical elements and provide for leveling of the space transformer 234. The leveling pins 262 are adjusted so that brass spheres 266 provide a point contact with the space transformer 160. The spheres 266 contact outside the periphery of the LGA of the space transformer 160 to maintain isolation from electrical components. Leveling of the substrate is accomplished by precise adjustment of these spheres through the use of advancing screws 262, referred to as the leveling pins. Leveling pins 262 are adjustable to level the space transformer 160 and assure all the probes 140 will make contact with a wafer. The leveling pins 262 are screwed through supports 265 in the back plate 250. Motion of the leveling pin screws 262 is opposed by leaf springs 256 so that spheres 266 are kept in contact with the space transformer 160. The leaf springs 256 are designed to be much stronger than the interposer 232, so that raising and lowering the leveling screws 262 is opposed by the leaf springs 256 and the springs 242 and 244 of the interposer 232 serve only to assure electrical contact is maintained between the space transformer 160 as it moves relative to the PCB 165.

Although the present invention has been described above with particularity, this was merely to teach one of ordinary skill in the art how to make and use the invention. Many additional modifications will fall within the scope of the invention, as that scope is defined by the following claims.

What is claimed is:

1. A method of forming a contact element on a support substrate comprising:
   providing a first substrate;
   forming an intrusion in the first substrate, the intrusion for forming a contact tip for the contact element;
   applying a first layer of photoresist and patterning the photoresist to form openings over the intrusion and a region of the first 1 substrate adjacent the intrusion;
   applying a conductive layer over the exposed first substrate and first photoresist layer;
   applying and patterning a second layer of photoresist to form openings over a portion of the first photoresist layer and the first substrate separate from the intrusion;
   applying a resilient metal material in openings formed between regions of the second layer of photoresist and removing the second layer of photoresist;

applying an adhesive material over a portion of the contact element separate from the intrusion;
attaching the support substrate to the adhesive material;
removing the first photoresist material; and
removing the first substrate.

2. The method of claim 1, further comprising:
attaching the support substrate to a space transformer substrate having bond pads attached to routing lines within the space transformer substrate; and
wire bonding the contact element to one of the bond pads.

3. The method of claim 2, further comprising:
applying a metal ground plane region to the support substrate prior to attaching the support substrate to the contact element using the adhesive, wherein the adhesive is non-conductive to isolate the contact element from the ground plane region.

4. The method of claim 3, further comprising:
wire bonding the ground plane to one of the bond pads.

* * * * *